United States Patent [19]
Fang et al.

[11] Patent Number: 6,154,063
[45] Date of Patent: Nov. 28, 2000

[54] CLASS AB EMITTER FOLLOWER BUFFERS

[75] Inventors: Gary G. Fang, San Jose; David Castaneda, Sunnyvale; Chowdhury F. Rahim, Saratoga, all of Calif.

[73] Assignee: Maxim Integrated Products, Inc., Sunnyvale, Calif.

[21] Appl. No.: 09/299,359

[22] Filed: Apr. 26, 1999

[51] Int. Cl.$^7$ ............................................. H03K 19/018
[52] U.S. Cl. ............................................. 326/126; 326/92
[58] Field of Search ................................ 326/82, 88, 89, 326/92, 126

[56] References Cited

U.S. PATENT DOCUMENTS

| | | | |
|---|---|---|---|
| 4,071,783 | 1/1978 | Knepper | 326/88 |
| 4,443,715 | 4/1984 | Fox | 326/88 |
| 4,677,313 | 6/1987 | Mimoto | 326/88 |
| 5,028,818 | 7/1991 | Go Ang et al. | 326/88 |
| 5,451,903 | 9/1995 | Armstrong . | |
| 5,874,858 | 2/1999 | Furuya . | |

FOREIGN PATENT DOCUMENTS 196 16 443
A1 10/1997 Germany .

*Primary Examiner*—Michael Tokar
*Assistant Examiner*—Don Pau Le
*Attorney, Agent, or Firm*—Blakely, Sokoloff, Taylor & Zafman LLP

[57] ABSTRACT

Buffers having an output pull-up transistor controlled by the input signal, an output pull-down transistor and a pull-down transistor control circuit. A current source provides a current that is divided between the pull-up transistor and the pull-down transistor control circuit to maintain the desired output voltage. A boost capacitor is coupled between the output and the pull-down transistor control circuit to provide good dynamic response to the circuit even in the presence of substantial capacitive loads on the output. In addition a second capacitor is coupled between the pull-down transistor control circuit and a fixed voltage to provide a low frequency pole internal to the circuit. The connection of the boost capacitor to the pull-down transistor control circuit and the connection of the second capacitor to the pull-down transistor control circuit are separated by a substantial resistance, allowing the effect of each capacitor to be substantially independent of each other. Exemplary circuits are disclosed incorporating these and other features.

17 Claims, 6 Drawing Sheets

CLASS AB EMITTER FOLLOWER BUFFERS

BACKGROUND OF THE INVENTION

1. Field of the Invention

The present invention relates to buffers.

2. Prior Art

Buffers are commonly used to couple signals to an output to provide a low impedance output drive without substantial loading of the source of the signal. The preferred embodiment of the invention disclosed herein is intended for use in a high voltage digital-to-analog converter design of the R-2R type to buffer substantially constant voltages against changes in load, primarily capacitive loads, caused by the driving of MOSFET switches from the buffer output. In this specific application, certain buffer characteristics are needed which were not provided by the circuits of the prior art. These characteristics include the ability to operate at high voltages, a buffer output that can go as low as 0.5 volts from the low supply rail, a low quiescent current, a high peak output current when sourcing and sinking current to and from the output, and the capability of driving large capacitive loads without oscillation. While the present invention buffers provide the foregoing characteristics, the present invention buffers may also be advantageously used in circuits requiring less than all of the foregoing characteristics.

In the prior art, rail-to-rail output CMOS buffers will provide outputs as low as 0.5 volts from the low supply rail, though cannot be used at the high voltages for which the preferred embodiment is intended. When using bipolar circuitry, a simple emitter follower comprising an NPN bipolar transistor with a current source in the emitter circuit will not work either, as the circuit will not be able to sink high currents without requiring at least as much quiescent current, contrary to the desired low quiescent current requirements of the buffer. A buffer in the form of a class AB follower with both NPN and PNP transistors will also not provide the desired performance because its output cannot go down to 0.5 volts from the negative rail. In particular, the low voltage output swing is limited to at least one VBE above the rail, plus headroom for a current source. With respect to high voltage operation with the capability of sourcing and sinking high currents, a lateral PNP transistor can handle high voltages, though it has a limited current handling capability per unit transistor. A vertical PNP transistor can handle large currents, but its operating voltages are limited, and may not be adequate for a particular high voltage requirement.

One prior art buffer circuit is illustrated in FIG. 1. In this circuit, the relatively small current of current source $I_1$ will be mirrored by transistor Q6 and resistor R1 to transistor Q7 and resistor R2. In operation, node A is at a voltage 2 VBE above ground, namely, the VBE of transistor Q2 plus the VBE of transistor Q3. In the quiescent state, the voltage drop across resistor R3 is very small, and typically resistor R4 may be chosen to provide a one VBE voltage drop with a current there through of 1 $\mu$amp. Thus, Q4, Q5, Q3 and Q2 form a translinear loop. Also transistor Q2 is typically 10 times the size of the other transistors, so that for the translinear loop:

$$I_4 I_5 = I_3 \frac{I_2}{10}$$

or $I_2$ is approximately 9 $\mu$amps and $I_4$ is approximately 1 $\mu$amp.

When the input voltage $V_{IN}$ rises by the switching of a capacitive load, effectively turning off transistor Q1, substantially the full current of current source $I_1$, is mirrored by transistor Q6 and resistor R1 to transistor Q7 and resistor R2 to flow through transistors Q4 and Q5 and resistor R3. This increases the voltage drop across resistor R3 and somewhat increases the VBE's of transistors Q4 and Q5, increasing the conduction of transistor Q3 to turn on transistor Q2 much harder to provide a high current pull-down for the output $V_{OUT}$ until Q1 starts to turn on again and the circuit settles to its new quiescent condition.

The circuit of FIG. 1 comprises a one-sided loop. More specifically, when the output voltage $V_{OUT}$ goes higher than the quiescent value, the current through transistor Q1 will decrease. Now more of the current mirrored to resistor R2 will flow though transistor Q7, and transistors Q4, Q5 and resistor R3, turning transistor Q2 on harder to pull the output voltage back down. However if the output voltage $V_{OUT}$ is yanked lower than the quiescent value, the current through transistor Q1 will increase. If $V_{OUT}$ is yanked down by more than a few millivolts, this will cause transistor Q7 to shut off, shutting off transistor Q2 so that the left side of the loop is no longer active until the circuit approaches the quiescent state again.

To provide a current boost to node A, boost capacitor $C_Z$ is coupled between the output $V_{OUT}$ and the base-collector connection of transistor Q4. This current boost improves the dynamic performance of the circuit by providing a substantially immediate coupling of the change in the output voltage to the control of transistor Q2, causing transistor Q2 to oppose the change in the output voltage. Stability of the loop comprised of Q1, Q7, Q4, Q5 Q3 and Q2 can be assured by introducing a lower frequency pole through the use of a large capacitor $C_P$ coupled to the collector-base connection of transistor Q4, though the effectiveness of the boost capacitor $C_Z$ is substantially diminished, so that the dynamic performance of the buffer is quite adversely affected by doing so.

BRIEF SUMMARY OF THE INVENTION

The present invention buffers offer several significant benefits when compared with conventional buffer circuits. First, they consume very little quiescent current (about 35 $\mu$amps) while being capable of delivering large peak current (10 ma). Second, their quiescent current is very controlled, and is independent of supply voltages and process variations. Third, output voltage levels can be as low as 500 mV from Vss (or 500 mV from Vdd for their PNP versions). Fourth, they are capable of driving a wide range of capacitive load (0 pf to 100 pf) in spite of having two feedback loops. Fifth, their implementation requires NPNs and lateral PNPs (no vertical PNPs required) making them especially useful in situations where vertical PNPs cannot be used (i.e. operating supply voltages exceed the breakdown voltage of vertical PNPs, and/or lack of available vertical PNPs in a typical BiCMOS process).

These buffers are comprised of an output pull-up transistor whose output level is controlled by the input signal, an output pull-down transistor and a translinear loop which controls the pull-down transistor. A boost capacitor $C_P$ is coupled between the output and the pull-down transistor control circuit, and forms a high frequency feedback loop to allow large dynamic peak current (about 10 ma) to be delivered to the output load. A low frequency loop is used to help the output settle to the final value and regulate distribution of quiescent currents, maintaining total current consumption constant even though current gain of the translinear control loop for the pull-down transistor may vary. In the low frequency loop, a second capacitor $C_P$ and a resistor $R_P$ with substantial resistance are used to form a low frequency dominant pole to guarantee stability for a wide range of capacitive loads (0 pf to 100 pf). During transients, $R_P$ isolates the dominant pole capacitor $C_P$ so that the feedback current created through $C_Z$ can completely flow through the translinear loop controlling the pull-down transistor. By doing so, this transient current will not be diverted by $C_P$ to signal ground. This novel circuit configuration maintains stability for a wide range of capacitive loads while preserving its dynamic performance (delivering large peak current) during transients. Exemplary circuits are disclosed incorporating these and other features, including saturation protection for the output pull-up and pull-down transistors.

DETAILED DESCRIPTION OF THE PREFERRED EMBODIMENT

Figure 1:
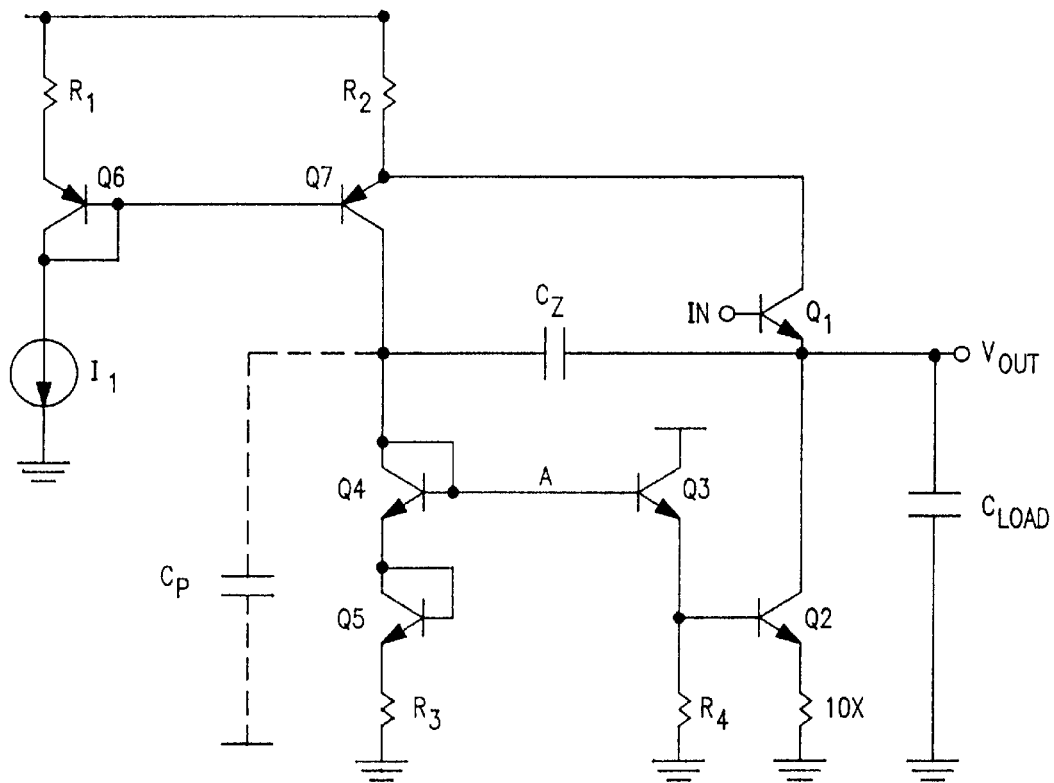
FIG. 1 is a circuit diagram for a prior art buffer.
Figure 2A:
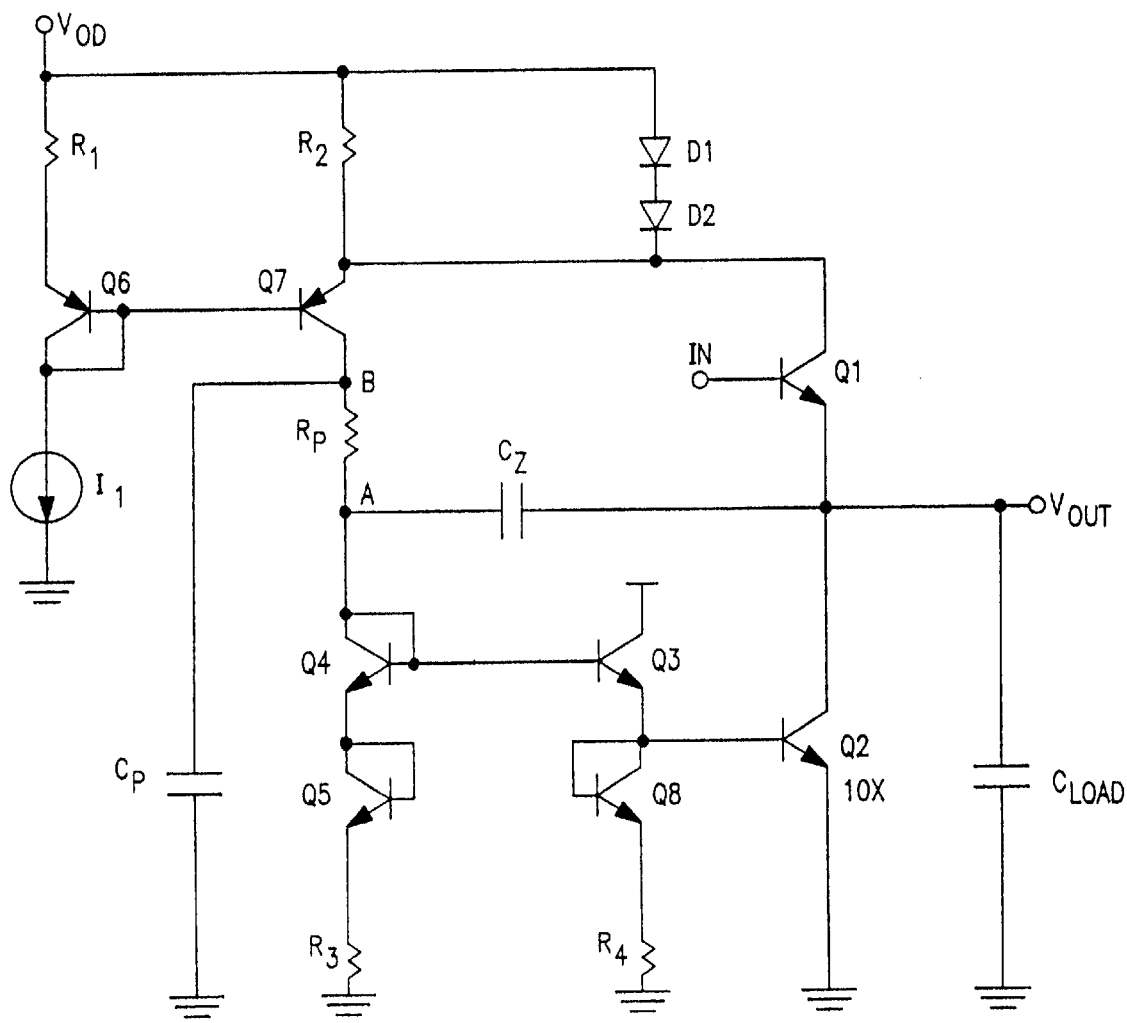
FIG. 2a is a circuit diagram for one embodiment of the present invention.

Now referring to FIG. 2a, a circuit diagram for one embodiment of the present invention may be seen. In this embodiment, transistors Q1 through Q7, resistors R1 through R4 and current source $I_1$ function basically as herein before described. In addition, however, diodes D1 and D2 have been added, as has transistor Q8, resistor $R_P$ and capacitor $C_P$. The power supply terminals for connecting to a power supply are identified in the Figure as VDD and by the conventional ground symbol. In the discussion to follow, transistor Q2 is assumed to be 10 times the size of the other transistors.

In steady state operation, the voltage drop across resistors R1 and R2 will normally be approximately 300 millivolts. The conduction threshold for each of diodes D1 and D2, however, will be approximately 0.7 volts, so that while the diodes are forward biased, they are not adequately forward biased for conduction. Also the 300 millivolt drop across each of resistors R1 and R2 will be much larger than any difference in the VBEs of transistors Q6 and Q7, so that the current of current source $I_1$ (approximately 10 $\mu$amps) will be mirrored to resistor R2 so long as transistor Q7 is conducting, regardless of the division of that current between transistors Q1 and Q7.

However, for sudden and substantial decreases in the output voltage $V_{OUT}$, transistor Q1 will be turned on much harder, causing the voltage drop across resistor R2 to increase, turning transistor Q7 off. At the same time the drop in the output voltage will be coupled by boost capacitor $C_Z$ to node A, turning off transistor Q2 so that the loop is cut. Thus the loop is a one sided loop for large signal response. Assuming that the transient drop in the output voltage is sufficient, diodes D1 and D2 will become forward biased to conduction, and during such transients, can source high levels of current for transistor Q1. Thus, diodes D1 and D2 can provide large transient currents through transistor Q1 when required for high current sourcing by the circuit, though the quiescent current for the exemplary circuit will remain in the 10 $\mu$amp region, most of which will flow through transistors Q1 and Q2. The diodes also prevent transistor Q1 from going into saturation, which could lead to a substantial drop in the beta of the transistor, and turn on a parasitic bipolar junction transistor and cause a latch-up.

In particular, in the exemplary embodiment, the resistances of resistors R3 and R4 are equal, and both are relatively small, such as 5 Kohms. Thus, because the resistors are small, transistors Q4, Q5, Q3 and Q8 form a translinear loop, as do transistors Q4, Q5, Q3 and Q2. Because transistor Q2 is ten times the size of the other transistors, the current in transistor Q2 (approximately 9 $\mu$amps in the quiescent state) will be approximately ten times the current in transistors Q4 and Q5 (approximately 1 $\mu$amp in the quiescent state), and transistors Q3 and Q8 (approximately 1 $\mu$amp in the quiescent state).

In an alternative embodiment, transistor Q8 can be eliminated, and the resistance of resistor R3 made to be on the order of 600 Kohms, so that a current on the order of slightly over 1 $\mu$amp through resistor R4 will provide a one VBE voltage drop (the VBE of transistor Q2). This level of current will adequately turn on transistor Q3 to minimize the response time of the loop. Since this will be provided by a current on the order of 1 $\mu$amp through transistors Q4 and Q5 and resistor R3, approximately 1 $\mu$amp will flow through transistor Q7, resistor $R_P$, transistors Q4 and Q5 and resistor R3, and approximately 9 $\mu$amps will flow through transistors Q1 and Q2 (assuming the entire load on the output of the circuit is a transient capacitive load so that the quiescent output current of the circuit is zero).

In FIG. 2a, the boost capacitor $C_Z$ provides the desired current boost for a fast dynamic response. The capacitor $C_P$, connected to node B rather than node A, does not significantly affect the dynamic current boost provided by the boost capacitor $C_Z$ because of the relatively large resistor $R_P$ there between, and maintains stability for a wide range of capacitive loads. The capacitor $C_P$, together with the resistor $R_P$, provides the desired dominant low frequency pole. This allows a much smaller capacitance for the capacitor $C_P$ to be used to produce the dominant pole roll-off because of the large value of the resistor $R_P$, in the preferred embodiment on the order of 250 Kohms. Not only does this avoid having the capacitor $C_P$ significantly diminish the effectiveness of the boost capacitor $C_Z$, but it further allows the use of a significantly lower value and thus smaller capacitor $C_P$, resulting in integrated circuit area savings.

Thus, $R_P$ separates node A from node B by a very substantial resistance, so that the capacitor $C_P$ will not affect the dynamic current boost provided by the boost capacitor $C_Z$. The net result is the presence of two loops in the circuit, a high frequency loop and a low frequency loop. The high frequency loop is comprised of transistor Q2, capacitor $C_Z$, transistors Q4 and Q5 and resistor R3, and transistors Q3 and Q8 and resistor R2 and transistor Q14. The low frequency loop is comprised of transistors Q2, Q1 and Q7, resistor $R_P$, transistors Q4 and Q5 and resistor R3, and transistors Q3 and Q8 and resistor R2 and transistor Q14. The high frequency loop via $C_Z$ results in a high peak sink current capability of the circuit, whereas the low frequency loop caused by the resistor $R_P$ and the capacitor $C_P$ provides a dominant pole internal to the circuit at a substantially lower frequency than the pole of the output. (The pole of the output of the circuit has a frequency of $g_{mQ1}/C_{LOAD}$, where $g_{mQ1}$ is the transconductance of transistor Q1, while the frequency of the dominant pole of the slower loop is $1/C_P R_P$.) This dominant pole has a lower frequency than the pole of the output even for relatively large values of the capacitive load $C_{LOAD}$.

The values of the capacitor $C_P$ and the resistor $R_P$ may be selected based on the following criteria. To assure that the dominant pole has a lower frequency than the pole of the output even for relatively large values of the capacitive load $C_{LOAD}$, and preferably a much lower frequency, $C_P$ and $R_P$ preferably should be selected so that:

$$\frac{1}{C_P R_P} \ll \frac{g_{mQ1}}{C_{LOAD_{max}}}$$

where $C_{LOAD_{max}}$ is the maximum capacitive load expected on the output of the buffer.

The larger $R_P$, the smaller $C_P$ will be for the same dominant pole frequency, saving integrated circuit chip area. This is particularly important when the buffer is replicated numerous times in a particular integrated circuit. However, too large a value of the resistor $R_P$ will cause too large a voltage drop across $R_P$, interfering with circuit operation, particularly when operating on low voltage supplies. Too low a value of $R_P$ will couple the capacitor $C_P$ into the high frequency loop, interfering with the dynamic boost provided by the capacitor $C_Z$. Thus it is desired to select $R_P$ so that the resistance of the resistor $R_P$ is greater, preferably much greater, than the impedance of the control circuit controlling the pull-down transistor as coupled to the resistor $R_P$, namely:

$$R_P \gg \frac{1}{g_{mQ4}} + \frac{1}{g_{mQ5}} + R4$$

Figure 2B:
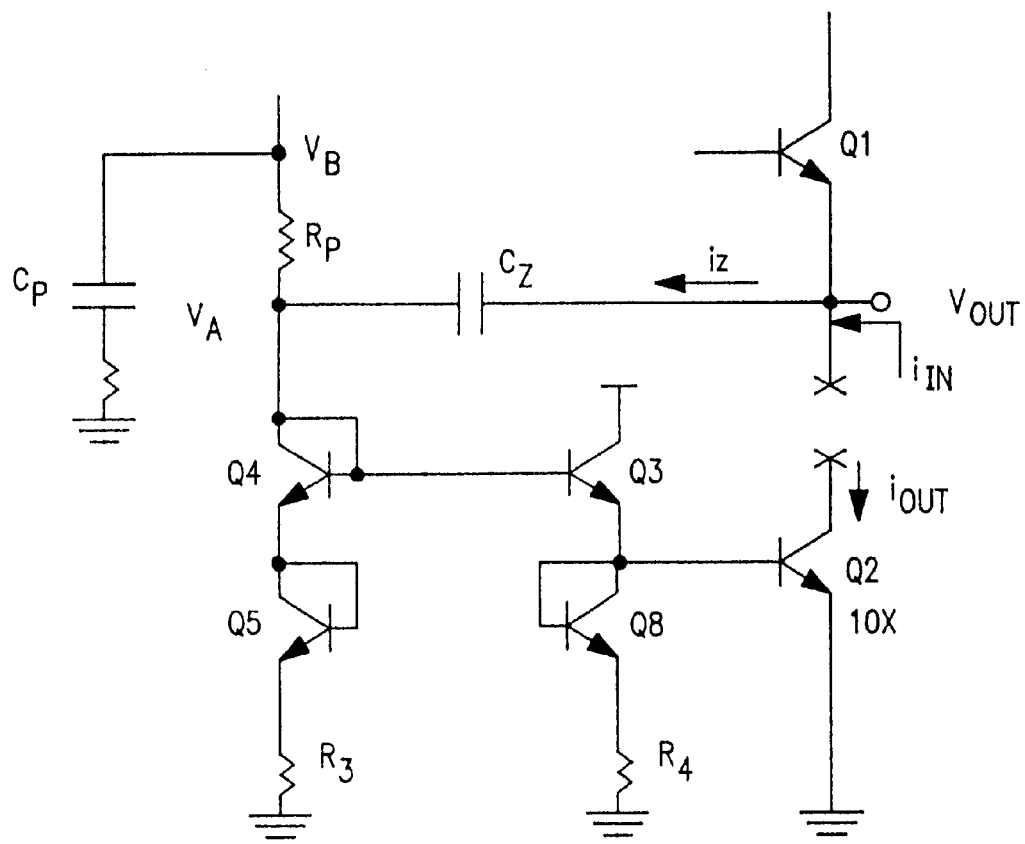
FIG. 2b repeats the circuit diagram of FIG. 2a, but labeled for purposes of an analysis showing the high frequency stability of the high frequency loop.

The stability of this high frequency loop can be shown as follows. Referring to FIG. 2b, assume that the loop is broken in the collector circuit of transistor Q2 (see the Xs in the collector circuit of transistor Q2 in FIG. 2b).

The impedance $R_Z$ seen by the capacitor $C_Z$ looking into the translinear loop is:

$$R_Z = \frac{1}{g_{mQ4}} + \frac{1}{g_{mQ5}} + R3 \cong \frac{2}{g_{mQ4}}$$

Since the resistance of the resistor $R_P$ is large in comparison, ($R_P \gg R_Z$):

$i_{Q4} = i_{Q5} = i_Z$ $$\therefore \frac{i_{OUT}}{i_Z} \cong \frac{i_{Q2}}{i_{Q4}} = 10$$

$$\frac{i_Z}{i_{IN}} = \frac{\frac{1}{g_{mQ1}}}{\frac{1}{g_{mQ1}} + \left(R_Z + \frac{1}{SC_Z}\right)} = \frac{SC_Z}{S(1 + R_Z g_{mQ1})C_Z + g_{mQ1}}$$

$$\therefore \frac{i_Z}{i_{IN}} = \left(\frac{1}{1 + R_Z g_{mQ1}}\right) \frac{\frac{S}{P}}{1 + \frac{S}{P}} \text{ where } P = \frac{g_{mQ1}}{(1 + R_Z g_{mQ1})C_Z}$$

$\rightarrow i_{Q2} = 10 i_{Q4} \rightarrow g_{mQ1} = g_{mQ2} = 10 g_{mQ4}$ $$R_Z = \frac{1}{g_{mQ4}} + \frac{1}{g_{mQ3}} + R3 \cong \frac{2}{g_{mQ4}}$$

$$\therefore 1 + R_Z g_{mQ1} \cong 1 + \left(\frac{2}{g_{mQ4}}\right)(10 g_{mQ4}) \cong 21$$

$$\therefore \frac{i_{OUT}}{i_{IN}} = \frac{i_{OUT}}{i_Z} \cdot \frac{i_Z}{i_{IN}} \cong \left(\frac{i_{Q2}}{i_{Q4}}\right) \cdot \frac{i_Z}{i_{IN}}$$

$$\therefore \frac{i_{OUT}}{i_{IN}} = (10) \cdot \left(\frac{1}{1 + R_Z g_{mQ1}}\right) \left(\frac{\frac{S}{P}}{1 + \frac{S}{P}}\right); \text{ where}$$

$$P = \frac{g_{mQ1}}{(1 + R_Z g_{mQ1})C_Z} \text{ and } \left|\frac{i_{OUT}}{i_{IN}}\right| = \text{loop gain in}$$

the high frequency loop

Figure 2C:
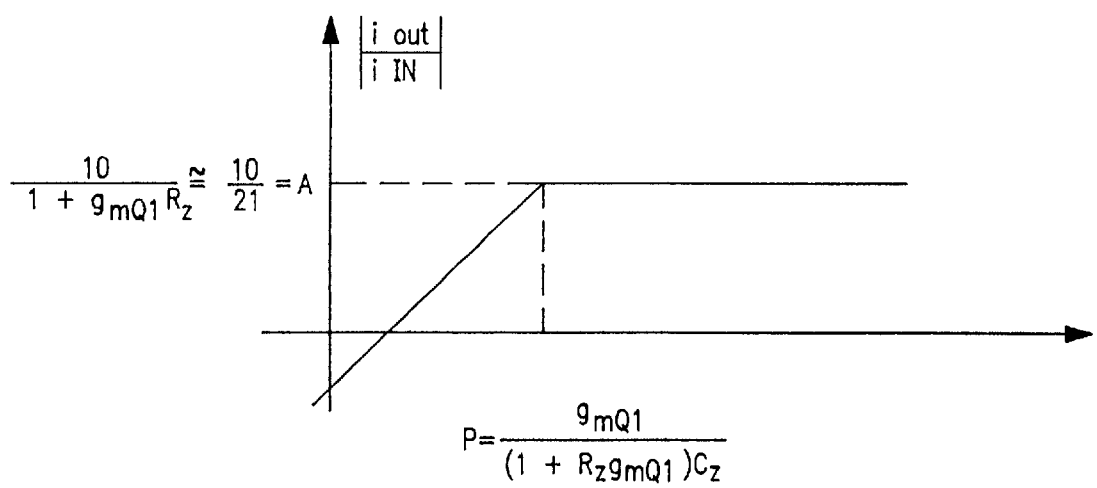
FIG. 2c is a plot showing the gain A versus frequency of the high frequency loop.

The magnitude response of the loop gain is illustrated in FIG. 2c, and has a maximum of A as follows:

$$A = \frac{10}{1 + g_{mQ1} R_Z} \cong \frac{10}{21}$$

Therefore, the loop gain $$\left|\frac{i_{OUT}}{i_{IN}}\right|$$

is always less than one, and thus the high frequency loop is always stable.

Figure 3:
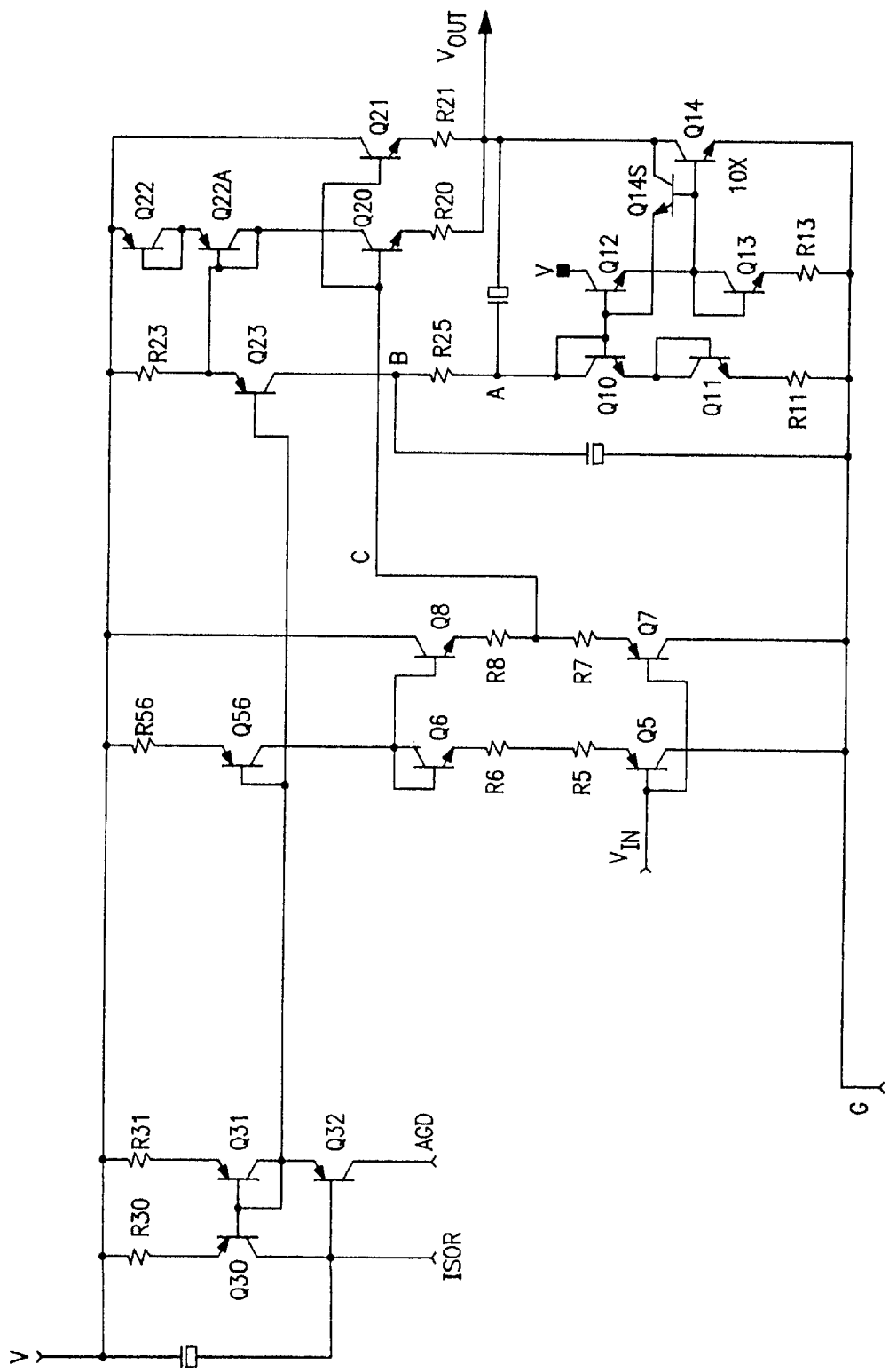
FIG. 3 is a circuit diagram for another embodiment of the present invention.

Now referring to FIG. 3, a more complete circuit diagram for an exemplary embodiment of the invention may be seen. In this circuit, V is the power supply voltage, G the ground voltage and AGD an analog ground.

The current through resistor R30 and transistor Q30 (approximately 10 μamps in an exemplary embodiment) is mirrored to transistor Q56 and resistor R56, as well as to transistor Q23 and resistor R23. The current mirrored to transistor Q23 and resistor R23 causes approximately 300 millivolts of IR drop in resistor R23, a large voltage in comparison to any variation in the VBE of transistor Q23. Accordingly, in the exemplary embodiment, the current through resistor R23 will be approximately 10 μamps, the mirrored current, whether most of it flows or only a small portion of it flows through transistor Q23. As before, in the quiescent state, diode-connected transistors Q22 and Q22A are not adequately forward biased to conduct (assuming substantially zero quiescent output current to sustain the output voltage $V_{OUT}$ on a capacitive load).

The current through transistor Q6, resistors R6 and R5 and transistor Q5 (10 μamps) is effectively mirrored to transistor Q8, resistors R8 and R7 and transistor Q7. The voltage at the junction between resistor R8 and R7, in turn, is coupled to the bases of transistors Q20 and Q21. In this embodiment, resistors R5 through R8 and resistors R20 and R21 are of very low resistance. With the quiescent current through each of transistors Q7, Q20 and Q21, node C will be one VBE (the VBE of transistor Q7) above the input voltage $V_{IN}$. The output voltage $V_{OUT}$ will be one VBE (the VBE of transistor Q20 or transistor Q21) lower than the voltage of node C, so that the output voltage $V_{OUT}$ will quite accurately track the input voltage $V_{IN}$.

In the circuit of FIG. 3, transistor Q14S provides saturation protection to the pull-down transistor Q14. Transistor Q14 has its base connected to the emitter of transistor Q12 and the collector and base of diode-connected transistor Q13, the emitter of transistor Q13 being connected to ground through resistor R13. The base of transistor Q12 is connected to the base and collector of diode-connected transistor Q10, which in turn is connected in series with diode-connected transistor Q11 and resistor R11. Since transistor Q14 is 10 times larger than the other transistors in the circuit, the current through transistor Q14 will be approximately 10 times that flowing through transistor Q23, resistor $R_P$, diode-connected transistors Q10 and Q11 and resistor R11. Also, approximately one half of the current through transistor Q14 passes through transistor Q20 and one half through transistor Q21. Consequently the current through transistor Q20 is approximately 8.33 $\mu$amps and the current through transistor Q23, resistor $R_P$, diode-connected transistors Q10 and Q11 and resistor R11 is approximately 1.67 $\mu$amps (10 $\mu$amps total). Also because transistors Q20 and Q21 are the same size and resistor R21 equals resistor R20, approximately 8.33 $\mu$amps will flow through transistor Q21 and resistor R21, providing approximately 16.7 $\mu$amps through transistor Q2. The use of transistor Q21 and resistor R21 substantially in parallel with transistor Q20 and resistor R20 reduces the transconductance of the output by a factor of approximately 2, increasing the effectiveness of $R_P$ and $C_P$.

In the circuit of FIG. 3, the current splitting between transistors Q20 and Q21 allows the current gain between transistors Q10 and Q14 to be twice as high as that of the embodiment of FIG. 2a without increasing the loop gain of the low frequency loop. The higher current gain can enhance performance of the high frequency current boost loop via the capacitor $C_Z$.

Figure 4:
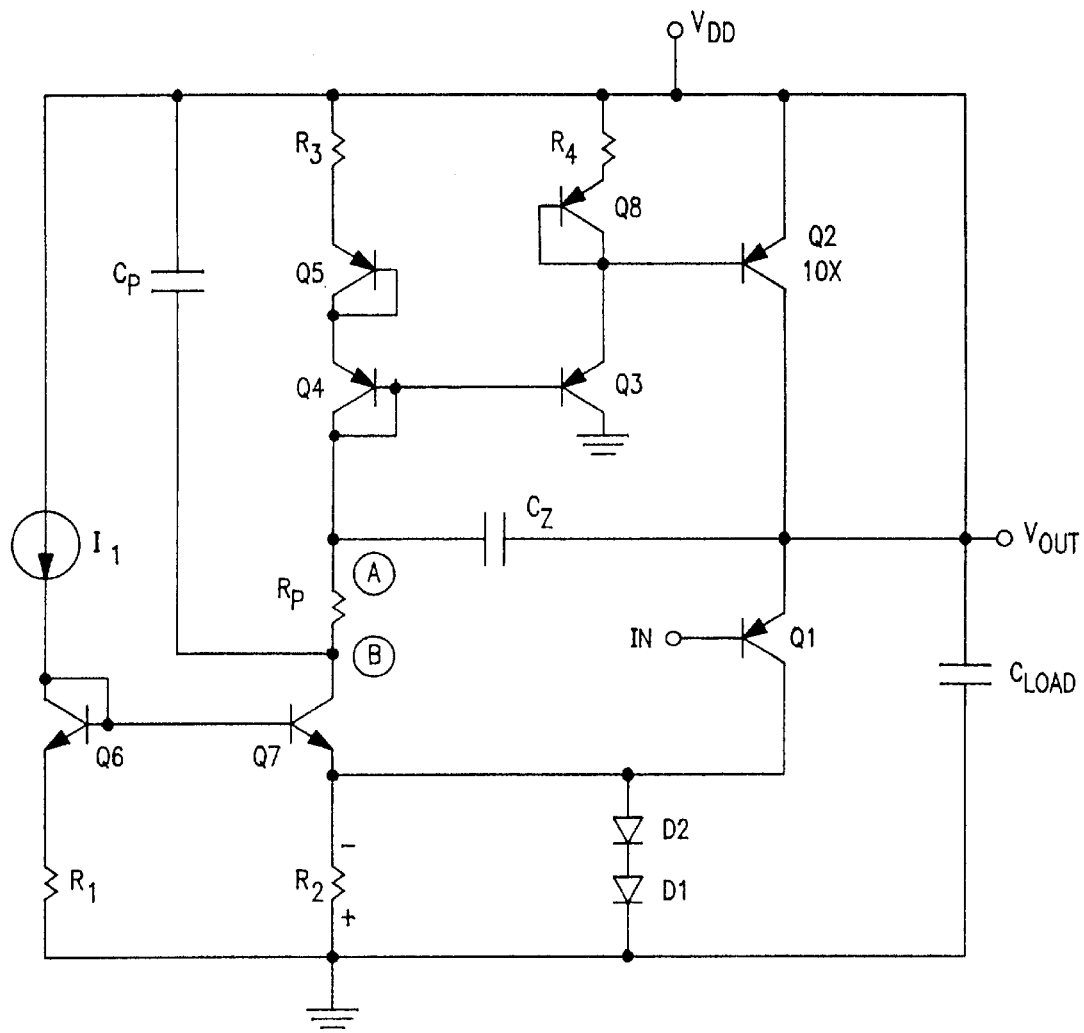
FIG. 4 is a circuit diagram for an embodiment of the present invention similar to that of FIG. 2a using transistors of the opposite conductivity type.

There has been described herein a new and unique buffer which has a good dynamic response and which maintains stability even when driving a wide range of capacitive loads. The exemplary embodiments specifically disclosed herein utilize bipolar transistors of a specific conductivity type, and is particularly advantageous when using a BiCMOS process (vertical NPN and lateral PNP transistors) for device fabrication. However it is to be understood that similar circuits can be realized by one skilled in the art using transistors of different types or of the opposite respective conductivity type. By way of example, FIG. 4 illustrates just such an exemplary circuit. In this circuit, devices performing similar functions to those of FIG. 2a are given the same identification. However, the emitter follower connected device (a PNP transistor in FIG. 4) becomes a pull-down device, as opposed to the NPN pull-up transistor Q1 of FIG. 2a. Similarly, the detailed circuit designs may be altered by those skilled in the art without deviating from the invention. Thus, while preferred embodiments of the present invention have been disclosed and described herein, it will be obvious to those skilled in the art that various changes in form and detail may be made therein without departing from the spirit and scope of the invention.

What is claimed is:

1. A buffer coupled to first and second power supply connections comprising:

a first current source coupled to a first power supply terminal for supplying at least a minimum current;

first and second transistors, each having first and second terminals and a control terminal, the voltage between the control terminal and the second terminal controlling the current flow between the first terminal and the second terminal of the respective transistor;

the first transistor having its first terminal coupled to the first current source and its second terminal coupled to a buffer output and to the first terminal of the second transistor, the control terminal of the first transistor being coupled as the buffer input, the second transistor having its second terminal coupled to the second power supply terminal;

a first resistor;

a control circuit coupled through the first resistor to the first current source, and to the control terminal of the second transistor, the control circuit controlling conduction of current through the second transistor responsive to the current through the control circuit from the first current source;

a boost capacitor coupled between the buffer output and the node between the control circuit and the first resistor; and, a second capacitor coupled between one of the power supply terminals and the node between the first resistor and the first current source.

2. The buffer of claim 1 wherein the transistors are junction transistors.

3. The buffer of claim 1 wherein the control circuit and the second transistor comprise a translinear loop.

4. The buffer of claim 3 wherein the second transistor is substantially larger than the rest of the transistors in the translinear loop.

5. The buffer of claim 1 wherein the buffer output has a capacitive load thereon.

6. The buffer of claim 1 wherein the first current source comprises a current mirrored from a second current source.

7. The buffer of claim 1 wherein the first current source comprises a second resistor, the second resistor being coupled to the first resistor through a third transistor, and a second current source mirroring current to the second resistor and third transistor when the third transistor is conducting.

8. The buffer of claim 7 wherein the first power supply terminal is coupled to the first terminal of the first transistor through at least one diode, the forward conduction voltage drop of the at least one diode between the first power supply terminal and the first terminal of the first transistor being larger than the voltage across the second resistor when the third transistor is conducting.

9. A buffer coupled to first and second power supply terminals and having a buffer input, and a buffer output for coupling to a capacitive load, comprising:

a junction transistor circuit having;

a first current source coupled to a first power supply terminal;

first and second transistors, each having first and second terminals and a control terminal, the voltage between the control terminal and the second terminal controlling the current flow between the first terminal and the second terminal of the respective transistor;

the first transistor having its first terminal coupled to the first current source and its second terminal coupled to the buffer output and to the first terminal of the second transistor, the control terminal of the first transistor being coupled to the buffer input, the second transistor having its second terminal coupled to a second power supply terminal;

a first resistor;

a control circuit coupled through the first resistor to the first current source, and to the control terminal of the second transistor, the control circuit controlling conduction of current through the second transistor responsive to the current through the control circuit from the first current source;

a boost capacitor coupled between the buffer output and the node between the control circuit and the first resistor; and, a second capacitor coupled between one of the power supply terminals and the node between the first resistor and the first current source;

one divided by the product of the capacitance of the second capacitor and the first resistor being less than the transconductance of the first transistor divided by the capacitance of the capacitive load;

the resistance of the first resistor being greater than the impedance of the control circuit controlling the pull-down transistor as coupled to the resistor $R_P$.

10. The buffer of claim 9 wherein the control circuit is a translinear loop.

11. The buffer of claim 10 further comprised of a third transistor coupled to the second transistor and the translinear loop to provide saturation protection to the second transistor.

12. The buffer of claim 10 wherein the second transistor is substantially larger than the rest of the transistors in the translinear loop.

13. The buffer of claim 9 wherein the first current source comprises a current mirrored from a second current source.

14. The buffer of claim 9 wherein the first current source comprises a second resistor, the second resistor being coupled to the first resistor through a third transistor, and a second current source mirroring current to the second resistor and third transistor when the third transistor is conducting.

15. The buffer of claim 9 wherein the first power supply terminal is coupled to the first terminal of the first transistor through at least one diode, the forward conduction voltage drop between the first power supply terminal and the first terminal of the first transistor being larger than the voltage across the first second resistor caused by the current of the first current source.

16. The buffer of claim 9 wherein the first power supply terminal is the positive power supply terminal, and the first and second transistors are NPN transistors.

17. The buffer of claim 9 wherein the second power supply terminal is the positive power supply terminal, and the first and second transistors are PNP transistors.

* * * * *